United States Patent
Dimitrov et al.

(10) Patent No.: US 7,940,600 B2
(45) Date of Patent: May 10, 2011

(54) NON-VOLATILE MEMORY WITH STRAY MAGNETIC FIELD COMPENSATION

(75) Inventors: Dimitar Dimitrov, Edina, MN (US); Olle Gunnar Heinonen, Eden Prairie, MN (US); Dexin Wang, Eden Prairie, MN (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 297 days.

(21) Appl. No.: 12/326,274

(22) Filed: Dec. 2, 2008

(65) Prior Publication Data

US 2010/0135067 A1 Jun. 3, 2010

(51) Int. Cl.
*G11C 8/00* (2006.01)
(52) U.S. Cl. .............. 365/230.07; 365/50; 365/173; 365/243.5
(58) Field of Classification Search ........... 365/48, 365/50, 55, 62, 171, 173, 209, 213, 225.5, 365/230.07, 230.32, 243.5
See application file for complete search history.

(56) References Cited

U.S. PATENT DOCUMENTS

| | | |
|---|---|---|
| 6,462,919 B1 | 10/2002 | Mack |
| 6,650,513 B2 | 11/2003 | Fullerton |
| 6,714,444 B2 | 3/2004 | Huai |
| 6,829,161 B2 | 12/2004 | Huai |
| 6,838,740 B2 | 1/2005 | Huai |
| 6,847,547 B2 | 1/2005 | Albert |
| 6,888,742 B1 | 5/2005 | Nguyen |
| 6,933,155 B2 | 8/2005 | Albert |
| 6,958,927 B1 | 10/2005 | Nguyen |
| 6,967,863 B2 | 11/2005 | Huai |
| 6,985,385 B2 | 1/2006 | Nguyen |
| 6,992,359 B2 | 1/2006 | Nguyen et al. |
| 7,057,921 B2 | 6/2006 | Valet |
| 7,088,609 B2 | 8/2006 | Valet |
| 7,110,287 B2 | 9/2006 | Huai |
| 7,126,202 B2 | 10/2006 | Huai |
| 7,161,829 B2 | 1/2007 | Huai |
| 7,170,778 B2 | 1/2007 | Kent et al. |
| 7,190,611 B2 | 3/2007 | Nguyen |
| 7,201,977 B2 | 4/2007 | Li |
| 7,230,845 B1 | 6/2007 | Wang |
| 7,233,039 B2 | 6/2007 | Huai |
| 7,241,631 B2 | 7/2007 | Huai |

(Continued)

OTHER PUBLICATIONS

M. Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

(Continued)

*Primary Examiner* — Hoai V Ho
*Assistant Examiner* — Jason Lappas
(74) *Attorney, Agent, or Firm* — Campbell Nelson Whipps LLC

(57) ABSTRACT

A method and apparatus for stray magnetic field compensation in a non-volatile memory cell, such as a spin-torque transfer random access memory (STRAM). In some embodiments, a first tunneling barrier is coupled to a reference structure that has a perpendicular anisotropy and a first magnetization direction. A recording structure that has a perpendicular anisotropy is coupled to the first tunneling barrier and a nonmagnetic spacer layer. A compensation layer that has a perpendicular anisotropy and a second magnetization direction in substantial opposition to the first magnetization direction is coupled to the nonmagnetic spacer layer. Further, the memory cell is programmable to a selected resistance state with application of a current to the recording structure.

26 Claims, 3 Drawing Sheets

U.S. PATENT DOCUMENTS

| | | |
|---|---|---|
| 7,242,048 B2 | 7/2007 | Huai |
| 7,242,631 B2 | 7/2007 | Fujioka et al. |
| 7,245,462 B2 | 7/2007 | Huai |
| 7,313,013 B2 | 12/2007 | Sun |
| 7,369,427 B2 | 5/2008 | Diao |
| 7,394,248 B1 | 7/2008 | Guo et al. |
| 7,430,135 B2 | 9/2008 | Hua |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,531,882 B2 | 5/2009 | Nguyen |
| 7,576,956 B2 | 8/2009 | Huai |
| 2005/0135020 A1 | 6/2005 | Sugita |
| 2005/0185455 A1 | 8/2005 | Huai |
| 2005/0201023 A1 | 9/2005 | Huai et al. |
| 2006/0187705 A1 | 8/2006 | Nakamura |
| 2006/0203503 A1 | 9/2006 | Casenave |
| 2007/0008661 A1 | 1/2007 | Min |
| 2007/0048485 A1 | 3/2007 | Jogo |
| 2007/0054450 A1 | 3/2007 | Hong |
| 2007/0063237 A1 | 3/2007 | Huai |
| 2007/0086121 A1 | 4/2007 | Nagase |
| 2007/0096229 A1 | 5/2007 | Voshikawa |
| 2007/0097734 A1 | 5/2007 | Min |
| 2007/0120210 A1 | 5/2007 | Yuan |
| 2007/0176251 A1 | 8/2007 | Oh |
| 2007/0188942 A1 | 8/2007 | Beach |
| 2007/0252186 A1 | 11/2007 | Yang |
| 2008/0062578 A1 | 3/2008 | Watanabe |
| 2008/0088980 A1 | 4/2008 | Kitagawa |
| 2008/0165453 A1* | 7/2008 | Kaiser et al. ............... 360/324.2 |
| 2008/0230819 A1 | 9/2008 | Nguyen |
| 2008/0273380 A1 | 11/2008 | Diao |
| 2008/0310213 A1 | 12/2008 | Chen |
| 2008/0310219 A1 | 12/2008 | Chen |
| 2009/0050991 A1 | 2/2009 | Nagai |
| 2009/0237987 A1 | 9/2009 | Zhu |
| 2009/0302403 A1 | 12/2009 | Nguyen |

OTHER PUBLICATIONS

K. Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

M. Nakayama, T. Kai, N. Shimomura, M. Amano, E. Kitagawa, T. Nagase, M. Yoshikawa, T. Kishi, S. Ikegawa and H. Yoda, "Spin transfer switching in TbCoFe/CoFeB/MgO/CoFeB/TbCoFe magnetic tunnel junctions with perpendicular magnetic anisotropy," Journal of Applied Physics 103, 07A710, 2008, pp. 1-3, American Institute of Physics.

S. Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Berger, Physic Rev. B 54, 9353 (1996).

Diao et al., "Spin-transfer switching in MgO-based magnetic tunnel junctions" J. Appl. Phys. 99, 08G510 (2006).

Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

Li et al., "Effects of MgO tunnel barrier thickness on magnetohysteresis in perpendicularly magnetized magnetic tunnel junctions of GdFeCo/FeCo/MgO/FeCo/TbFe/Co" *J. Appl. Phys. 99*, 08T310 (2006).

Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

PCT Search Report and Written Opinion dated Jul. 21, 2010, Our Ref; 14962WO00.

PCT Search Report and Written Opinion dated Jun. 14, 2010, Our Ref: 14545WO00.

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

Slonczewski, J.C. Current-driven excitation of magnetic multilayers. *Journal of Magnetism and Magnetic Materials* 159, L1-L7 (1996).

Sun, J.Z. Spin-current interaction with a monodomain magnetic body: A model study. *Phys. Rev. B* 62, 570 (2000).

U.S. Appl. No. 12/200,034 Xi et al., filed Aug. 28, 2009.

U.S. Appl. No. 12/233,764 Gao et al., filed Sep. 19, 2008.

U.S. Appl. No. 12/269,537 Tang et al., filed Nov. 12, 2008.

U.S. Appl. No. 12/248,237, filed Oct. 9, 2008, Inventor: Zhu, (Ref. 14230).

U.S. Appl. No. 12/326,274 filed Dec. 2, 2008, Inventor: Dimitrov; Our Ref: 14783.00.

U.S. Appl. No. 12/398,214, filed Mar. 5, 2009, Inventor: Wang, (Ref. 14545).

Xi et al., "Perpendicular magnetization and exchange bias in epitaxial Cu/Ni/Fe50Mn50 thin films" *Phys. Rev. B* 72, 024447 (2005).

Xi, Haiwen and Robert M. White, Antiferromagnetic Thickness Dependence of Exchange Biasing, Physical Review B, vol. 61, No. 1, Jan. 1, 2000-1.

\* cited by examiner

NON-VOLATILE MEMORY WITH STRAY MAGNETIC FIELD COMPENSATION

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell operation, particularly with regard to the writing data to a memory cell.

SUMMARY

Various embodiments of the present invention are directed to a method and apparatus for stray magnetic field compensation in a non-volatile memory, such as but not limited to a STRAM memory cell.

In accordance with various embodiments, a first tunneling barrier is coupled to a reference structure that has a perpendicular anisotropy and a first magnetization direction. A recording structure that has a perpendicular anisotropy is coupled to the first tunneling barrier and a nonmagnetic spacer layer. A compensation layer that has a perpendicular anisotropy and a second magnetization direction in substantial opposition to the first magnetization direction is coupled to the nonmagnetic spacer layer. Further, the memory cell is programmable to a selected resistance state with application of a current to the recording structure.

In other embodiments, a memory cell is provided that comprises a first tunneling barrier, a reference structure coupled to the first tunneling barrier that has a perpendicular anisotropy and a first magnetization direction, a second tunneling barrier, a recording structure coupled to the first and second tunneling barriers that has a perpendicular anisotropy, and a compensation layer coupled to the second tunneling barrier that has a perpendicular anisotropy and a second magnetization direction in general opposition to the first magnetization direction. The memory cell is programmed to a selected resistance state by applying a spin polarized current to the recording structure.

These and various other features and advantages which characterize the various embodiments of the present invention can be understood in view of the following detailed discussion and the accompanying drawings.

DETAILED DESCRIPTION

Figure 1:
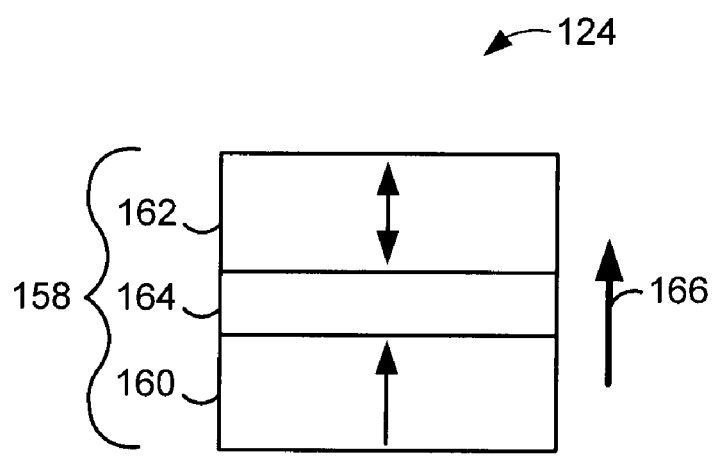
FIG. 1 shows a conventional memory cell.

FIG. 1 shows a memory cell 124 with a magnetic tunneling junction (MTJ) 158. The MTJ 158 has a fixed magnetic layer 160 and a free magnetic layer 162 with a tunneling barrier 164 between them. As a write current 166 flows through the MTJ 158, the interaction between the free electrons and the magnetization of the fixed reference layer 160 polarizes the electric current. The polarized electric current subsequently creates a magnetic torque to set the free layer with a desired magnetization direction. The relationship of the magnetizations of the free layer 162 and the fixed layer 160 correspond to either a high resistance state or a low resistance state. That is, if the free layer 162 and fixed layer 160 have the same magnetic direction, a low resistance state will be present in the MTJ 160. In contrast, opposing magnetic directions between the fixed layer 160 and the free layer 162 indicate a high resistance state.

Figure 2:
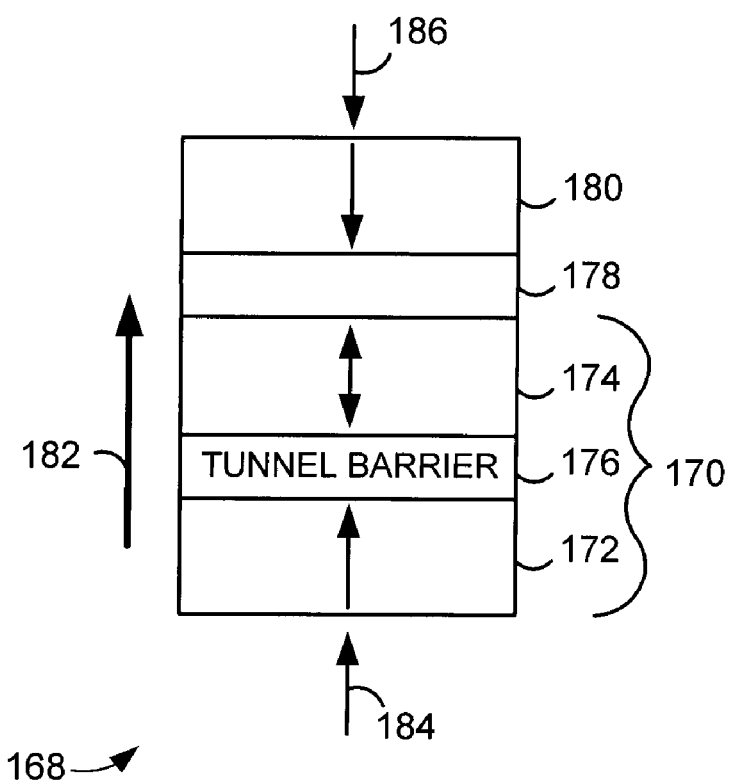
FIG. 2 displays a memory cell operated in accordance with the various embodiments of the present invention.

In FIG. 2, a memory cell 168 constructed in accordance with various embodiments of the present invention is displayed. The memory cell 168 comprises a MTJ 170 that has a reference structure 172 and a recording structure 174 coupled to a first tunneling barrier 176. A second tunneling barrier or a nonmagnetic spacer layer 178 located adjacent a compensation layer 180 is coupled to the recording structure 174. In some embodiments, a second tunneling barrier layer is chosen to enhance the spin-torque and reduce the switching current of memory cell 168. The passage of a write current 182 through the memory cell 168 results in the programming of the recording structure 174 with a magnetic direction that dictates either a high resistance state or a low resistance state based on the magnetic relationship with the reference structure 172.

The recording structure 174 and reference structure 172 can be constructed with multiple layers and materials that perform different functions. For example, the reference structure 172 can include a spin polarizing layer with a predetermined magnetization to polarize the spin the electrons of the incoming write current 182. Further in some embodiments, the spin polarizing layer is exchange coupled to a hard magnetic layer that provides the fixed magnetization of the reference structure 172.

In addition, the compensation layer 180, recording structure 174, and reference structure 172 have perpendicular anisotropy (PA). Anisotropy is a state of a material that has different properties along different axes. The PA of the compensation layer 180 is perpendicular to the plane. In some embodiments, the magnetization direction is opposite to that of the reference structure 172 in order to cancel the stray magnetic field generated by the reference layer 172. The material of the compensation layer 180 and the second tunnel junction or a nonmagnetic spacer layer 178 are selected not only to cancel any stray magnetic fields but to produce negligible, or even zero, spin torque or tunneling magneto resistive effect on the recording structure 174.

In one embodiment, the memory cell 168 is configured with opposing magnetizations between the reference structure 172 and the compensation layer 180 by employing a plurality of set magnetic fields. A first set magnetic field 184 aligns the hard magnet of the reference structure 172. Subsequently, a second magnetic field 186 is provided to align the magnetization of the compensation layer 180. In some embodiments, the first magnetic field is greater than the second magnetic field in order to provide magnetizations of opposing directions. There are other ways to align the magnetization directions of the reference structure 172 and the compensation layer 180 in substantially opposing directions 172 and 180 could be made with materials with differing coercivities. Then a two-step process using a large field to align one material and a subsequent set to align the other material can achieve opposing directions.

Figures 3, 4:
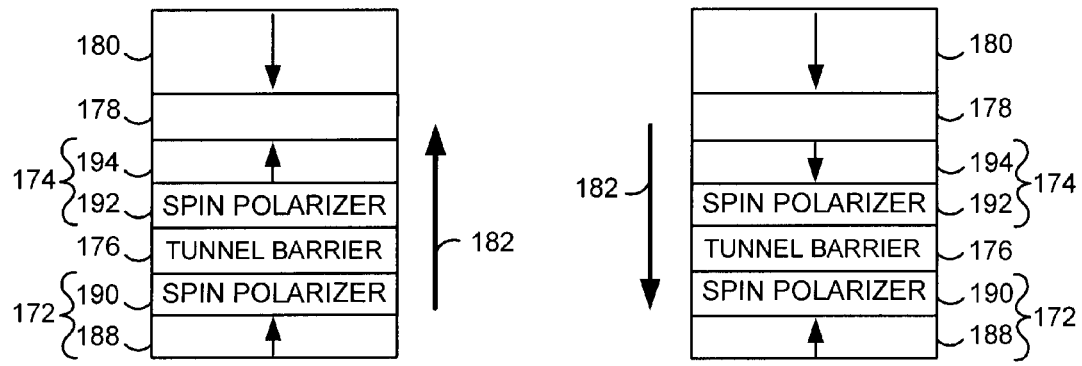
FIG. 3 provides a memory cell operated in accordance with the various embodiments of the present invention with a write current in a first direction.
FIG. 4 shows a memory cell operated in accordance with the various embodiments of the present invention with a write current in a second direction.

FIG. 3 shows the memory cell 168 of FIG. 2 operated in accordance with various embodiments of the present invention. The reference structure 172 of the memory cell 168 comprises a plurality of layers including, but not limited to, a PA reference layer 188 and a spin polarizing layer 190. In certain embodiments, the PA reference layer 188 can comprise a hard magnet, or other suitable materials. The first tunneling barrier 176 is coupled to both a first spin polarizing layer 190 of the reference structure 172 as well as a second spin polarizing layer 192 of the recording structure 174. A PA recording layer 194 is included in the recording structure 174 to allow stable PA. In addition, the compensation layer 180 and second tunneling junction 178 are coupled to the recording structure 174 in a substantially similar manner as FIG. 2.

As a write current 182 passes through the memory cell 168, the recording structure 174 is set in the desired orientation after the electric current has been polarized by the first spin polarizing layer 190 and traversing the first tunneling barrier 176. In some embodiments, the magnetic relationship between the recording structure 174 and the reference structure 172 correspond to either a high resistance state or a low resistance state by having a parallel or anti-parallel orientation. It should be noted that the high and low resistance states can be matched to a predetermined logical state to allow data to be stored in the memory cell 168.

FIG. 4 displays the memory cell 168 of FIG. 2 operated in accordance with various embodiments of the present invention. With the flow of the write current 182 in an opposite direction than shown in FIG. 3, an anti-parallel magnetic relationship is established between the recording structure 174 and the reference structure 172 creating a high resistance state. In some embodiments, the write current 182 causes the recording structure 174 to switch magnetic directions through the reflection of spin polarized electrons from the PA reference structure 172. It can be appreciated by one skilled in the art that the compensation layer 180 and second tunneling barrier 178 are configured to provide negligible spin momentum and TMR effect on the recording structure 174 while allowing the compensation layer 180 to cancel the stray magnetic field generated by the reference structure 174. In some embodiments, the configuration of the second tunneling barrier 178 comprises a nonmagnetic metallic material whose band structure matches either the majority or minority electron band of the compensation layer 180.

Figures 5, 6:
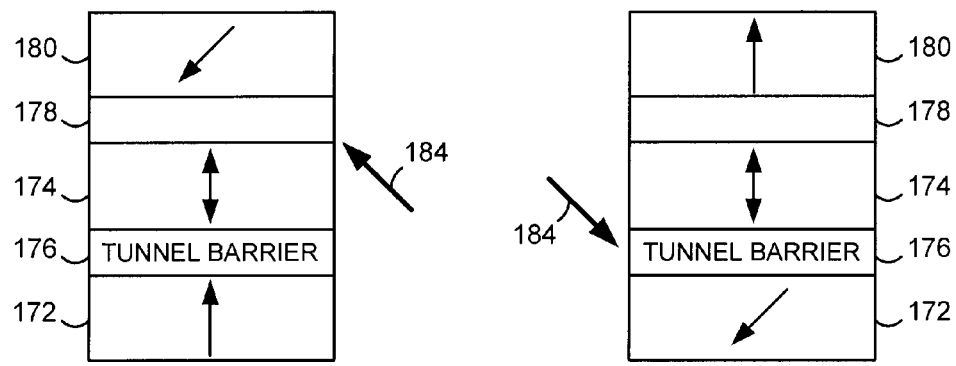
FIG. 5 illustrates a memory cell operated in accordance with the various embodiments of the present invention with a set magnetic field in a first orientation.
FIG. 6 displays a memory cell operated in accordance with the various embodiments of the present invention with a set magnetic field in a second orientation.

FIG. 5 shows the memory cell 168 of FIG. 2 in accordance with further embodiments. The magnetic direction of the compensation layer 180 is configured in a non-normal orientation to improve the cancellation of stray magnetic fields generated by the reference structure 172. That is, the direction of the magnetization of the compensation layer 180 is set to an angle with respect to a vertical or horizontal plane. The configuration of the compensation layer 180 to a non-normal orientation allows for the use of a single step for the setting of the magnetizations of the compensation layer 180 and the reference structure 172. To achieve that a set magnetic field 184 whose direction bisects the angle between the desired orientations of the compensation layer 180 and the reference structure 172 is used to configure the memory cell 168.

In some embodiments, the second tunneling barrier or spacer layer 178 is configured to manipulate the magnetization of the compensation layer 180 so that the PA axis of least resistance is non-normal. In one embodiment, this can be accomplished by proper material for 178. This material could be CoCrPt, CoPt, or multilayers of Co/Pt or Co/Pd. Although skewed, the respective magnetization directions of the compensation layer 180 and the reference structure 172 remain in opposition. The non-normal magnetization directions can also be achieved by angled deposition during fabrication. In one embodiment, the material used is hexagonally close packed Cobalt. Alternatively, magnetic annealing can be used to achieve non-normal directions. Suitable materials would exhibit phase change transformation during anneal, like forms of FePt or CoPt.

FIG. 6 displays the memory cell 168 of FIG. 2 configured in accordance with yet further embodiments of the present invention. The reference structure 172 is configured to have a non-normal magnetic orientation while the compensation layer 180 maintains an initial magnetization. To achieve this magnetic configuration a set magnetic field 184 whose direction bisects the angle between the desired orientations of the compensation layer 180 and the reference structure 172 is used to configure the memory cell 168.

It should be noted that in some embodiments the set magnetic field 184 is the only set field used to configure the magnetization of the memory cell 168. Further in some embodiments, the configuration of the memory cell 168 is conducted prior to an initial resistance state being programmed to the recording structure. As before, the respective magnetization directions of the compensation layer 180 and the reference structure 172 remain in general opposition.

Figure 7:
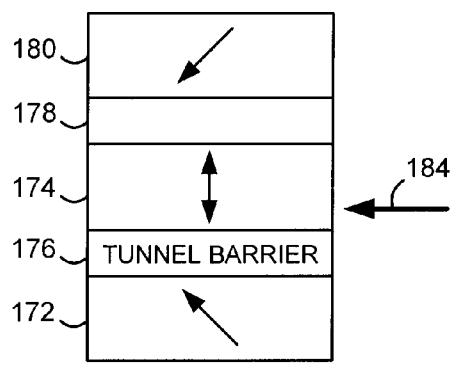
FIG. 7 provides a memory cell operated in accordance with the various embodiments of the present invention with a set magnetic field in a third orientation.

FIG. 7 provides the memory cell 168 of FIG. 2 operated in accordance with still further embodiments of the present invention. The set magnetic field 184 is applied to the memory cell as a substantially perpendicular path to the initial magnetic direction of the compensation layer 180 and the reference structure 172. The set magnetic field 184 affects the magnetic orientation of both the compensation layer 180 and the reference structure 172 to result in non-normal opposing magnetizations. In some embodiments, the second tunneling barrier or spacer layer 178 is configured to manipulate the magnetization of the compensation layer 180 so that the PA axis of least resistance is non-normal. Opposition of the respective magnetization directions of the reference structure 172 and compensation layer 180 is maintained.

Figure 8:
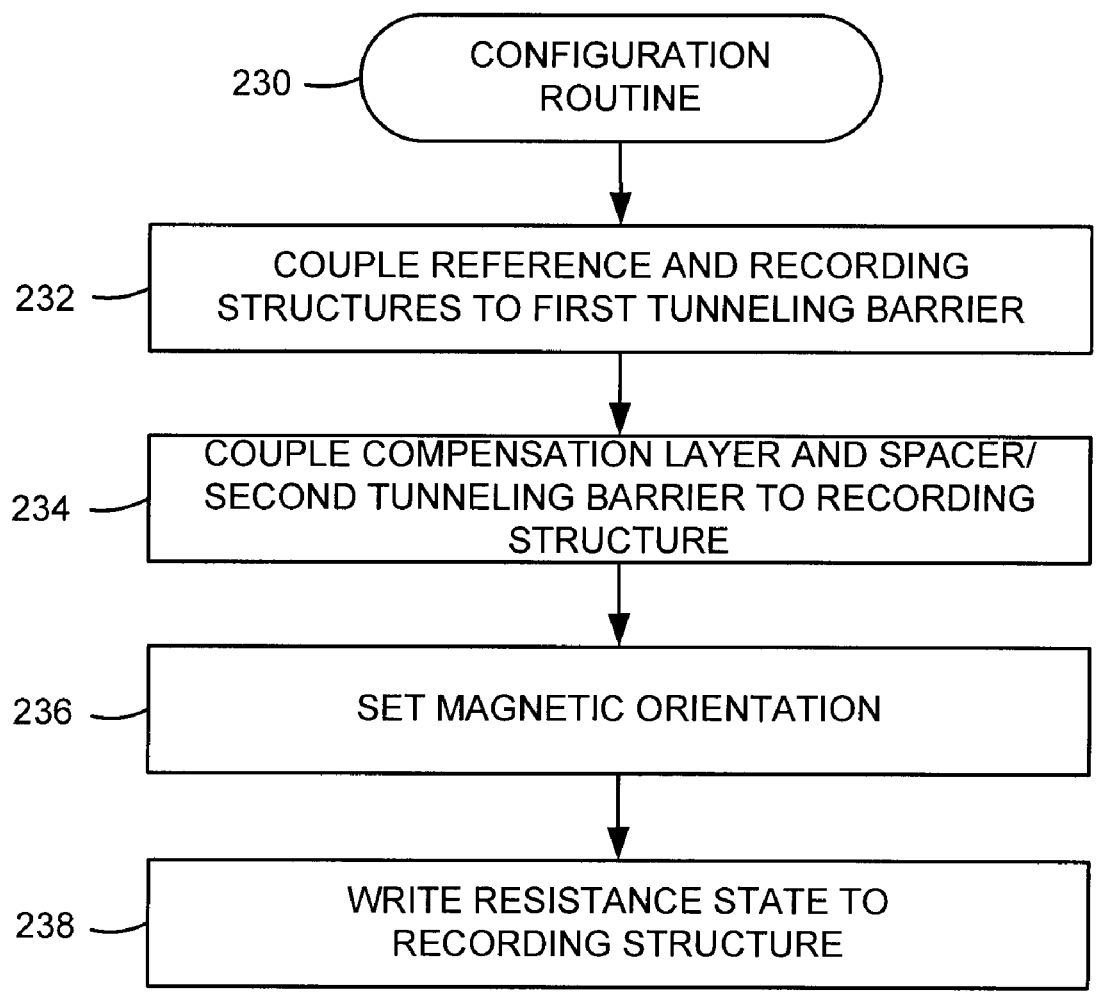
FIG. 8 shows a flow diagram for a configuration routine performed in accordance with the various embodiments of the present invention.

FIG. 8 displays a flow diagram of a configuration routine 230 performed in accordance with various embodiments of the present invention. The reference structure 172 and recording structure 174 are coupled to the first tunneling barrier at step 232. The recording structure 174 is further coupled to the second tunneling barrier or spacer layer 178 that is adjacent to the compensation layer 180 at step 234. The magnetic orientation of the components of the memory cell 168 is configured at step 236 by at least one set magnetic field.

It can be appreciated that one or numerous set magnetic fields of equal or different magnitude can be utilized to configure the magnetization of the memory cell. Likewise, the passage of the set current or currents can vary depending on the desired component and magnetization.

In step 238, a resistance state and corresponding logical state is written to the recording structure 174 of the memory cell 168. In some embodiments, the memory cells 168 are individually programmable to allow for a single bit, or a plurality of bits to written at a single time. Additionally, the individually programmable nature of the memory cells 168 negates any conditioning or initial operation for data to be written to the bit after the configuration routine 230 is completed.

As can be appreciated by one skilled in the art, the various embodiments illustrated herein provide advantageous writing of data to a memory cell in a fast and reliable manner. The ability to configure a memory cell to cancel stray magnetic fields allows for consistent data writing and reading. In fact, the required write current is reduced due to improved symmetry of directional current passage through the memory cell. Moreover, a highly consistent data rate can be achieved due to improved magnetic stability of the memory cell. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory cell comprising:
a first tunneling barrier;
a reference structure coupled to the first tunneling barrier, the reference structure having a perpendicular anisotropy and a first magnetization direction;
a nonmagnetic spacer layer;
a recording structure coupled to the first tunneling barrier and nonmagnetic spacer layer, the recording structure having a perpendicular anisotropy; and
a compensation layer coupled to the nonmagnetic spacer layer, the compensation layer having a perpendicular anisotropy and a second magnetization direction in substantial opposition to the first magnetization direction, wherein the memory cell is programmable to a selected resistance state by application of a current to the recording structure.

2. The memory device of claim 1, wherein the reference structure comprises a spin polarizing layer.

3. The memory device of claim 2, wherein the reference structure comprises a hard magnet.

4. The memory device of claim 1, wherein the compensation layer is magnetized to cancel a stray magnetic field generated by the reference structure.

5. The memory device of claim 1, wherein the first and second magnetization directions oppose each other.

6. The memory device of claim 1, wherein both the first and second magnetization directions are non-normal.

7. The memory device of claim 1, wherein either the first magnetization direction is non-normal while the second magnetization direction is normal or the second magnetic direction is non-normal while the first magnetic direction is normal.

8. The memory device of claim 1, wherein the nonmagnetic spacer layer comprises a metallic material whose band structure matches either the majority or minority electron band of the compensation layer.

9. The memory device of claim 1, wherein the first magnetization direction is set with a first set magnetic field and the second magnetization direction is set with a second set magnetic field.

10. The memory device of claim 1, wherein the first and second magnetization directions are set with a single set magnetic field.

11. The memory device of claim 1, wherein the compensation layer generates no spin momentum or tunneling magnetoresistive (TMR) effect.

12. The memory device of claim 1, wherein the nonmagnetic spacer layer comprises a second tunneling barrier layer.

13. A method comprising:
providing a memory cell comprising a first tunneling barrier, a reference structure coupled to the first tunneling barrier and having a perpendicular anisotropy and a first magnetization direction, a second tunneling barrier, a recording structure coupled to the first and second tunneling barriers and having a perpendicular anisotropy, and a compensation layer coupled to the second tunneling barrier and having a perpendicular anisotropy and a second magnetization direction in general opposition to the first magnetization direction; and
programming the memory cell to a selected resistance state by applying a spin polarized current to the recording structure.

14. The method of claim 13, wherein the reference structure comprises a spin polarizing layer.

15. The method of claim 13, wherein the compensation layer is magnetized to cancel a stray magnetic field generated by the reference structure.

16. The method of claim 13, wherein both the first and second magnetization directions are non-normal.

17. The method of claim 13, wherein either the first magnetization direction is non-normal while the second magnetization direction is normal or the second magnetic direction is non-normal while the first magnetic direction is normal.

18. The method of claim 13, wherein the first magnetization direction is set with a first set magnetic field and the second magnetization direction is set with a second set magnetic field.

19. The method of claim 13, wherein the first and second magnetization directions are set with a single set magnetic field.

20. The method of claim 13, wherein the compensation layer generates no spin momentum or tunneling magnetoresistive (TMR) effect.

21. An article, comprising:
a first tunneling barrier;
a reference structure coupled to the first tunneling barrier, the reference structure having a perpendicular anisotropy and a first magnetization direction;
a nonmagnetic spacer layer;
a recording structure coupled to the first tunneling barrier and nonmagnetic spacer layer, the recording structure having a perpendicular anisotropy; and
a compensation layer coupled to the nonmagnetic spacer layer, the compensation layer having a perpendicular anisotropy and a second magnetization direction in substantial opposition to the first magnetization direction, wherein the article is programmable to a selected resistance state by application of a current to the recording structure.

22. The article of claim 21, wherein the reference structure comprises a spin polarizing layer.

23. The article of claim 22, wherein the reference structure comprises a hard magnet.

24. The article of claim 21, wherein the compensation layer is magnetized to cancel a stray magnetic field generated by the reference structure.

25. The article of claim 21, wherein the first and second magnetization directions oppose each other.

26. The article of claim 21, wherein the nonmagnetic spacer layer comprises a metallic material whose band structure matches either the majority or minority electron band of the compensation layer.

* * * * *